United States Patent
Tanaka et al.

(10) Patent No.: US 7,230,243 B2
(45) Date of Patent: Jun. 12, 2007

(54) METHOD AND APPARATUS FOR MEASURING THREE-DIMENSIONAL SHAPE OF SPECIMEN BY USING SEM

(75) Inventors: Maki Tanaka, Yokohama (JP); Atsushi Miyamoto, Yokohama (JP); Hidetoshi Morokuma, Hitachinaka (JP); Chie Shishido, Yokohama (JP); Mitsuji Ikeda, Hitachinaka (JP); Yasutaka Toyoda, Hitachi (JP)

(73) Assignee: Hitachi High-Technologies Corporation, Tokyo (JP)

(*) Notice: Subject to any disclaimer, the term of this patent is extended or adjusted under 35 U.S.C. 154(b) by 0 days.

(21) Appl. No.: 11/156,478

(22) Filed: Jun. 21, 2005

(65) Prior Publication Data

US 2005/0285034 A1    Dec. 29, 2005

(30) Foreign Application Priority Data

Jun. 23, 2004    (JP)    ............... 2004-184682

(51) Int. Cl.
  *H01J 37/28*    (2006.01)
  *G01N 23/00*    (2006.01)
  *G21K 7/00*    (2006.01)
  *G06K 9/00*    (2006.01)

(52) U.S. Cl. .............. 250/310; 250/399; 250/306; 250/307; 250/311; 250/492.3

(58) Field of Classification Search ............... 250/310, 250/399
    See application file for complete search history.

(56) References Cited

U.S. PATENT DOCUMENTS 5,161,201 A * 11/1992 Kaga et al. ............. 382/145
5,331,275 A * 7/1994 Ozaki et al.
5,391,871 A * 2/1995 Matsuda et al.
5,729,343 A * 3/1998 Aiyer ..................... 356/504
6,515,296 B1 * 2/2003 Komatsu et al.
6,545,763 B1 * 4/2003 Kim et al. ............... 356/503
6,891,170 B1 * 5/2005 Yu et al. ................ 250/442.11
6,967,335 B1 * 11/2005 Dyer et al. ............. 250/442.11

(Continued)

FOREIGN PATENT DOCUMENTS

JP    2000-146558    5/2000
JP    2000-348658    12/2000

*Primary Examiner*—Nikita Wells
*Assistant Examiner*—Bernard Souw
(74) *Attorney, Agent, or Firm*—Antonelli, Terry, Stout & Kraus, LLP.

(57) ABSTRACT

The present invention relates to a method and apparatus for measuring a three-dimensional profile using a SEM, capable of accurately measuring the three-dimensional profile of even a flat surface or a nearly vertical surface based on the inclination angle dependence of the amount of secondary electron image signal detected by the SEM. Specifically, a tilt image obtaining unit obtains a tilt image (a tilt secondary electron image) I(2) of flat regions a and c1 on a pattern to be measured by using an electron beam incident on the pattern from an observation direction φ(2). Then, profile measuring units presume the slope (or surface inclination angle) at each point on the pattern based on the obtained tilt image and integrate successively each presumed slope value (or surface inclination angle value) to measure three-dimensional profiles S2a and S2c. This arrangement allows a three-dimensional profile to be accurately measured.

15 Claims, 10 Drawing Sheets

U.S. PATENT DOCUMENTS

| | | |
|---|---|---|
| 6,986,280 B2 * | 1/2006 | Muckenhirn |
| 7,049,589 B2 * | 5/2006 | Yamaguchi et al. |
| 2002/0179851 A1 * | 12/2002 | Sato et al. |
| 2003/0168594 A1 * | 9/2003 | Muckenhirn |
| 2004/0124364 A1 * | 7/2004 | Sato et al. |
| 2004/0164245 A1 * | 8/2004 | Ojima et al. |
| 2004/0183013 A1 * | 9/2004 | Nakasuji et al. |
| 2004/0195507 A1 * | 10/2004 | Yamaguchi et al. |
| 2005/0029467 A1 * | 2/2005 | Yu et al. .............. 250/442.11 |
| 2005/0087686 A1 * | 4/2005 | Honda et al. .............. 250/307 |
| 2005/0184235 A1 * | 8/2005 | Abe |
| 2005/0237537 A1 * | 10/2005 | Leizerson et al. .......... 356/504 |
| 2005/0285034 A1 * | 12/2005 | Tanaka et al. .............. 250/310 |
| 2006/0192118 A1 * | 8/2006 | Tashiro et al. .............. 250/310 |

* cited by examiner

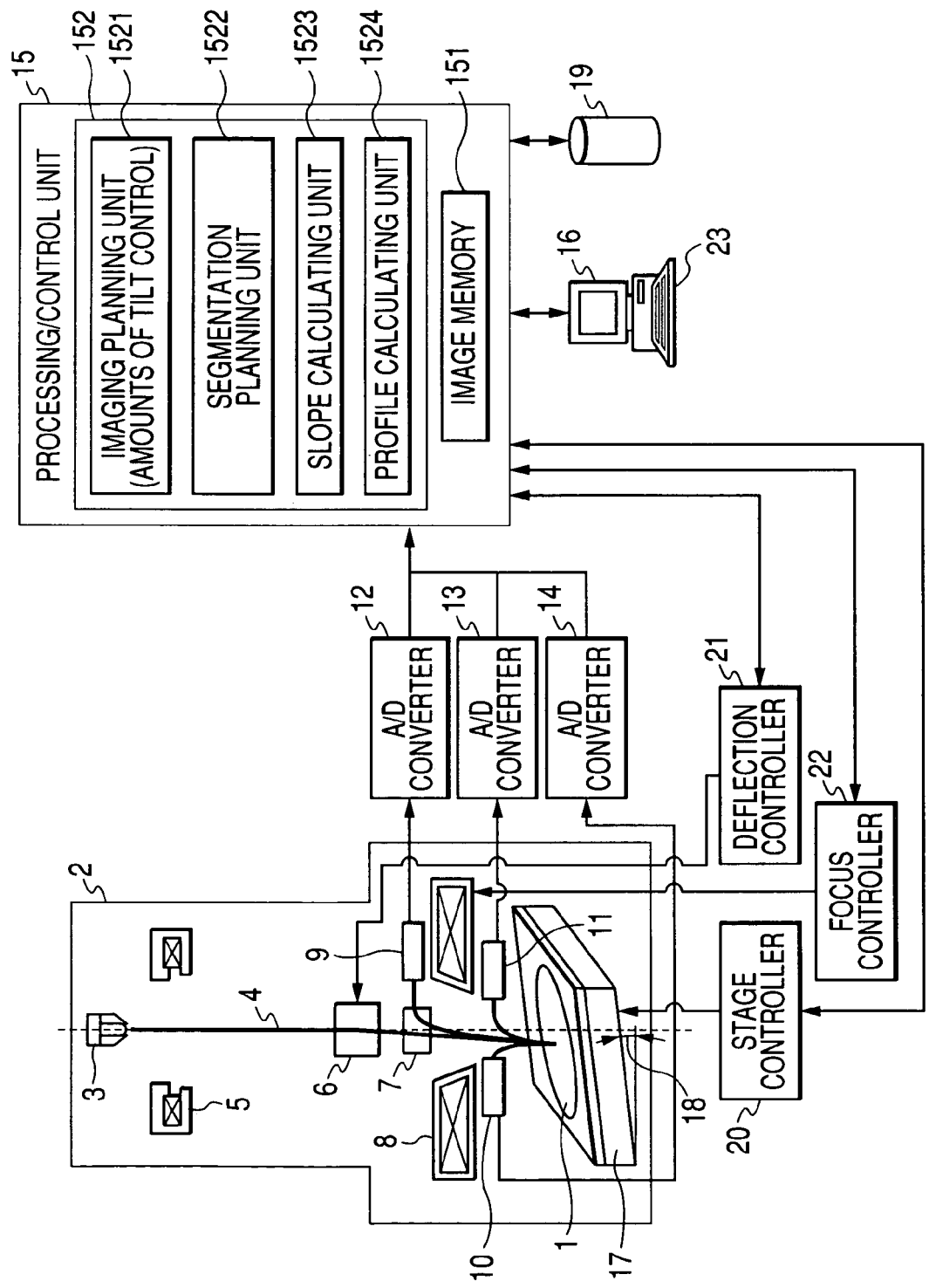

METHOD AND APPARATUS FOR MEASURING THREE-DIMENSIONAL SHAPE OF SPECIMEN BY USING SEM

BACKGROUND OF THE INVENTION

The present invention relates to a method and apparatus for measuring or estimating the three-dimensional profile of a specimen such as a semiconductor wafer in a semiconductor manufacturing process based on images obtained by observing the specimen using an SEM (Scanning Electron Microscope) when the specimen is observed or measured.

With the miniaturization of semiconductor devices, the pre-process for manufacturing these devices is becoming increasingly difficult to control. The electrical characteristics of a semiconductor device pattern are very much affected by its height and line width and the inclination angles of the sidewalls, as well as minute pattern shape variations such as the roundness of the corners. As such, there has been a need to accurately measure these dimensions and shapes to detect process variations and thereby control the process. Thus, effectively controlling the manufacturing process of a semiconductor device requires techniques for observing the sidewalls of the semiconductor device pattern by use of an SEM and estimating its three-dimensional profile based on images obtained by the SEM. Information in relation with SEM images of the specimen as observed obliquely is useful in the above sidewall observation and estimation of the three-dimensional profile.

There are three methods of obtaining an SEM image of a specimen as observed obliquely. One is to deflect the electron beam emitted from a particle source by a pre-lens deflection unit and to redirect the deflected electron beam to the target with a tilt angle by the combined action of an objective lens and an in-lens deflection unit so as to obtain a tilt image of the target (see, e.g., Japanese Patent Laid-Open No. 2000-348658.) Another method is to tilt the stage itself to obtain a tilt image, which is used to move the semiconductor wafer so as to be able to observe any points on the wafer. The other method is to mechanically tilt the SEM electron optical system itself to obtain a tilt image.

Japanese Patent Laid-Open No. 2000-146558 discloses a method for determining gradient on surface to which images are formed with electron beam from a scanning electron microscope (SEM). This method comprises the steps of: processing a calibration procedure which includes the step of obtaining a plurality of calibration electron emission measurements by measuring secondary electron emission from surface portions positioned at respective known different angles $\theta$ to the electron beam and the step of deriving a relationship between the plurality of calibration secondary electron emission measurements and the known angles $\theta$; and processing a gradient determination procedure which includes the step of measuring secondary electron emission obtained from each scanning point on the surface of the sample by scanning the electron beam along the surface of the sample and the step of determining the gradient at each scanning point of the surface by deriving angles $\theta$ based on the measured secondary electron emissions and the calibration relationship between the plurality of calibration secondary electron emission measurements and the known angles $\theta$.

Conventionally, as described above, an inclination angle (or slope) at each point of the surface is presumed by using by a certain function such as $1/\cos(\theta)$, or by using a data table (indicating a relationship between the inclination angle and the amount of secondary electron signal) obtained based on measurements on actual samples as the relationship between the inclination angle and the amount of secondary electron signal. Then, the height information of the surface is obtained by integrating the presumed inclination angle value at each point along the surface. However, since the sensitivity to the inclination angle in the amount of secondary electron signal varies with the inclination angle, it has been difficult to accurately estimate the height information on a flat portion or a nearly vertical portion.

SUMMARY OF THE INVENTION

The present invention has been devised to solve the above problems. It is, therefore, an object of the present invention to provide a method and apparatus for measuring a three-dimensional profile using an SEM, capable of accurately measuring the three-dimensional profile of even a flat surface or a nearly vertical surface based on the tilt angle dependence of the amount of secondary electron image signal detected by the SEM.

To achieve the above object, the present invention provides a method and apparatus for measuring a three-dimensional profile using an SEM, comprising: a tilt image obtaining step of scanning at least a region of a pattern to be measured with a focused electron beam incident on the region in an observation direction, and detecting the amount of secondary electron signal emitted from the region as a result of the scanning to obtain a tilt secondary electron image (i.e., a secondary electron image of a tilted object) of the region, wherein the region normally allows for only capture of a tilt secondary electron image with pixel values which indicate a small change in the amount of secondary electron signal per unit tilt angle change or which are not well approximated by a model modeling an actual relationship between the tilt angle and the amount of secondary electron signal (this region is hereinafter referred to as "region allowing for only low sensitivity or an inaccurate approximation") and wherein the observation direction allows for capture of a tilt secondary electron image with pixel values which indicate a large change in the amount of secondary electron signal per unit tilt angle change and which are well approximated by the model modeling the actual relationship between the tilt angle and the amount of secondary electron signal (this secondary electron image is hereinafter referred to as "secondary electron image that has high sensitivity and that is well approximated"); and a profile measuring step of calculating (presuming) the slope at each coordinate point on the region based on the amount of secondary electron signal at each coordinate point in the tilt secondary electron image of the region obtained at the tilt image obtaining step, and integrating successively the calculated slope value at each coordinate point to measure (yield) a three-dimensional profile of the region.

Further, another aspect of the present invention provides a method and apparatus for measuring a three-dimensional profile using a SEM, comprising: a region determining step of determining a region on a pattern to be measured, wherein the region allows for only low sensitivity or an inaccurate approximation; a tilt image obtaining step of scanning the pattern with a focused electron beam incident on the pattern in an observation direction, and detecting the amount of secondary electron signal emitted from the region as a result of the scanning to obtain a tilt secondary electron image, wherein the observation direction allows for capture of a tilt secondary electron image that has high sensitivity and that is well approximated; a profile measuring step of calculating (presuming) the slope at each coordinate point on the pattern based on the amount of secondary electron signal at each coordinate point in the tilt secondary electron image obtained at the tilt image obtaining step, and integrating successively the calculated slope value at each coordinate point to measure (yield) a three-dimensional profile of the pattern; and an extracting step of extracting a three-dimensional profile of the region from the three-dimensional profile of the pattern based on coordinates of the region and the observation direction, wherein the region is determined at the region determining step and the three-dimensional profile of the pattern is measured at the profile measuring step.

Further, still another aspect of the present invention provides a method and apparatus for measuring a three-dimensional profile using an SEM, comprising: a region determining step of scanning a pattern to be measured with a focused electron beam incident on the pattern at a normal angle, detecting the amount of secondary electron signal emitted from the pattern as a result of the scanning to obtain a normal secondary electron image, and determining a region on the pattern based on the amounts of secondary electron signal within said normal secondary electron image, wherein the region allows for only low sensitivity or an inaccurate approximation; a tilt image obtaining step of scanning at least the above region on the pattern with a focused electron beam incident on the region at an angle different from the normal incident angle, detecting the amount of secondary electron signal emitted from the region as a result of the scanning to obtain a tilt secondary electron image of the region; and a profile measuring step of calculating the slope at each coordinate point on the region based on the amount of secondary electron signal at each coordinate point in the tilt secondary electron image captured at the tilt image obtaining step, and integrating successively the calculated slope value at each coordinate point to measure (yield) a three-dimensional profile of the region. That is, the above method and apparatus of the present invention for measuring a three-dimensional profile using a SEM determines a region that allows for only low sensitivity to tilt angle change based on the amount of secondary electron signal at each point in a captured normal secondary electron image, calculates the slope at each point on the region based on a tilt secondary electron image obtained from a different beam incident direction, and integrates successively each calculated slope value to measure a three-dimensional profile.

According to yet another aspect of the present invention, the tilt image capturing step includes the steps of: scanning at least the above region on the pattern with focused electron beams incident on the region at a series of different angles; detecting variations in the amounts of secondary electron signal emitted from the region as a result of the scanning at the different beam incident angles; and determining the above observation direction based on the detected variations in the amounts of secondary electron signal. That is, the present invention scans a specimen with electron beams incident on the specimen at a series of different angles and determines an observation direction which allows for capture of a secondary electron image that has high sensitivity and that is well approximated.

According to yet another aspect of the present invention, the tilt image obtaining step includes determining the observation direction based on a cross-sectional profile model of the pattern.

Further, yet another aspect of the present invention provides a method and apparatus for measuring a three-dimensional profile using a SEM, comprising: a tilt image capturing step of scanning at least a region on a pattern to be measured with focused electron beams incident on the region at a series of different angles, and detecting the amounts of secondary electron signal emitted from the region as a result of the scanning at the different beam incident angles to obtain a plurality of tilt secondary electron images, wherein the region normally allows for only low sensitivity or an inaccurate approximation; and a selecting step of, from the plurality of secondary electron images obtained at the tilt image obtaining step, selecting a secondary electron image that has high sensitivity and that is well approximated.

Further, yet another aspect of the present invention provides a method and apparatus for measuring a three-dimensional profile using a SEM, comprising: a region determining step of determining a region on a pattern to be measured, wherein the region normally allows for only low sensitivity or an inaccurate approximation; a tilt image obtaining step of scanning the pattern with focused electron beams incident on the determined region at a series of different angles, and detecting the amounts of secondary electron signal emitted from the region as a result of the scanning at the different beam incident angles to obtain a plurality of tilt secondary electron images; and a selecting step of, from the plurality of secondary electron images obtained at the tilt image obtaining step, selecting a secondary electron image that has high sensitivity and that is well approximated with respect to the region.

According to yet another aspect of the present invention, the profile measuring step includes calculating the slope at each coordinate point on the region based on the amount of secondary electron signal emitted from each coordinate point on the region using a previously studied relationship between a sidewall inclination angle and the amount of secondary electron signal.

Further, yet another aspect of the present invention provides a method and apparatus for measuring a three-dimensional profile using a SEM, comprising: a region determining step of determining a first region and a second region on a pattern to be measured; a first profile measuring step of scanning the pattern with a focused electron beam incident on the pattern from a first observation direction, detecting the amount of secondary electron signal emitted from the pattern as a result of the scanning to obtain a tilt secondary electron image of the first region determined at the region determining step, and measuring a three-dimensional profile of the pattern as observed in the first observation direction based on the obtained tilt secondary electron image of the first region, wherein the first observation direction allows a tilt secondary electron image of the first region to be obtained such that the tilt secondary electron image has high sensitivity and is well approximated; and a second profile measuring step of scanning the pattern with a focused electron beam incident on the pattern from a second observation direction, detecting the amount of secondary electron signal emitted from the pattern as a result of the scanning to obtain a tilt secondary electron image of the second region determined at the region determining step, and measuring a three-dimensional profile of the pattern as observed from the second observation direction based on the obtained tilt secondary electron image of the second region, wherein the second observation direction allows a tilt secondary electron image of the second region to be obtained such that the tilt secondary electron image has high sensitivity and is well approximated.

Further, yet another aspect of the present invention provides a method and apparatus for measuring a three-dimensional profile using a SEM, comprising: a region determining step of determining a first region and a second region on a pattern to be measured; a tilt image obtaining step of scanning the pattern with focused electron beams incident on the pattern at a series of different directions with respect to the first and second regions determined at the region determining step, and detecting the amounts of secondary electron signal emitted from the pattern as a result of the scanning at the different beam incident angles to capture a plurality of tilt secondary electron images; and a selecting step of, from the plurality of secondary electron images obtained at the tilt image obtaining step, selecting a first tilt secondary electron image obtained at a first electron beam incident direction and further selecting a second tilt secondary electron image obtained at a second electron beam incident direction, wherein the first electron beam incident direction allows a tilt secondary electron image of the first region to be obtained such that the tilt secondary electron image has high sensitivity and wherein the second electron beam incident direction allows a tilt secondary electron image of the second region to be obtained such that the tilt secondary electron image is well approximated.

As used herein, "a tilt secondary electron image has high sensitivity" means that a tilt secondary electron image has pixel values which indicate a large change in the amount of secondary signal per unit inclination angle change; and "a tilt secondary electron image is well approximated" means that a tilt secondary electron image has pixel values which are well approximated by a model modeling an actual relationship between the inclination angle and the amount of secondary electron signal.

According to the present invention, in measurement of a three-dimensional profile using a SEM, the highly accurate measurement of the three-dimensional profile is enabled about a region which conventional techniques using a SEM, have not been able to accurately measure.

These and other objects, features, and advantages of the invention will be apparent from the following more particular description of preferred embodiments of the invention, as illustrated in the accompanying drawings.

BRIEF DESCRIPTION OF THE DRAWINGS

FIG. 1 is a diagram showing the configuration of an apparatus for measuring a three-dimensional profile using a SEM according to an embodiment of the present invention.

DESCRIPTION OF THE PREFERRED EMBODIMENTS

Figure 2A:
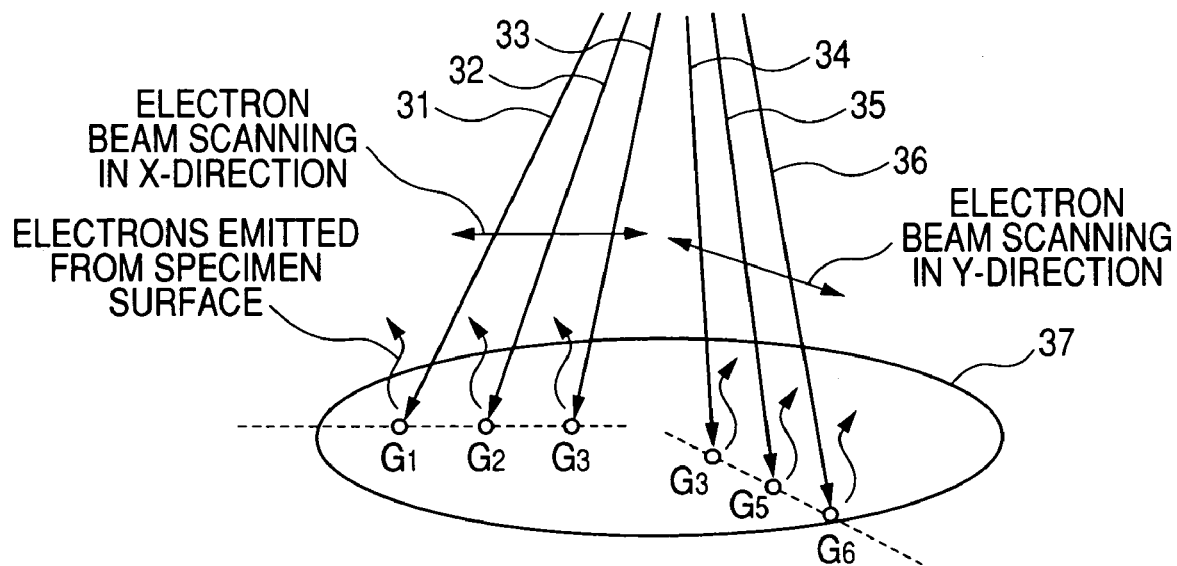
FIG. 2A is a perspective view of a semiconductor wafer, illustrating how secondary and reflected electrons are emitted from the surface of the semiconductor wafer when it is irradiated, or scanned, with an electron beam.

There will now be described methods and apparatuses for measuring a three-dimensional profile using an SEM (Scanning Electron Microscope) according to preferred embodiments of the present invention with reference to the accompanying drawings.

FIG. 1 is a diagram showing a system for obtaining and processing an SEM image according to an embodiment of the present invention. As shown in the figure, an electron optical system 2 comprises an electron beam source (an electron gun) 3 for emitting an electron beam 4, a condensing lens 5, a deflector 6, an ExB deflector 7, an objective lens 8, a secondary electron detector 9, and reflected electron detectors 10 and 11. Reference numeral 17 denotes a stage (X-Y-Z stage) on which a specimen 1 (e.g., a semiconductor wafer) is placed. The stage 17 includes a tilt stage for forming a stage tilt angle 18. It should be noted that the stage 17 can be tilted in the X- and Y-directions about tilt axes as a center which is substantially a vertical center of the pattern on the surface of the specimen 1. It goes without saying that the stage 17 is provided with laser length measuring machines (not shown) in the X- and Y-directions. Reference numeral 20 denotes a stage controller for controlling the stage (X-Y-Z stage) 17 inclusive of the tilt stage according to an instruction from a processing/control unit 15. That is, the tilt stage is tilted so as to provide the tilt angle 18 for the specimen 1 under the control of the stage controller 20. Reference numeral 21 denotes a deflection controller for controlling the deflector 6 according to an instruction from the processing/control unit 15 to deflect the focused electron beam 4 and to give tilt of the focused electron beam as incident direction to the specimen 1. Reference numeral 22 denotes a focus controller for controlling the current in the objective lens 8 according to an instruction from the processing/control unit 15 to further focus the focused electron beam on the surface of the specimen.

It should be noted that the ExB deflector 7 directs the secondary electrons generated from the specimen 1 to the secondary electron detector 9.

The electron beam 4 emitted from the electron beam source 3 is focused by the condensing lens 5 and deflected by the deflector 6. The deflected electron beam 4 is further focused by the objective lens 8 and directed onto the specimen 1 (e.g., a semiconductor wafer). It should be noted that the deflector 6 deflects the electron beam 4 so as to control the incident position of the electron beam 4 on the specimen 1. Upon receiving the electron beam 4, the specimen 1 emits secondary electrons and reflected electrons. The secondary electrons are detected (observed) by the secondary electron detector 9. On the other hand, the reflected electrons are detected (observed) by the reflected electron detectors 10 and 11. The reflected electron detectors 10 and 11 are disposed opposite each other. The secondary and reflected electrons detected (observed) by the secondary electron detector 9 and the reflected electron detectors 10 and 11, respectively, are converted by A/D converts 12, 13, and 14 into digital signals which are then stored in image memory 151 as image data. A CPU 152 performs image processing on the stored image data as necessary.

Figure 2B:
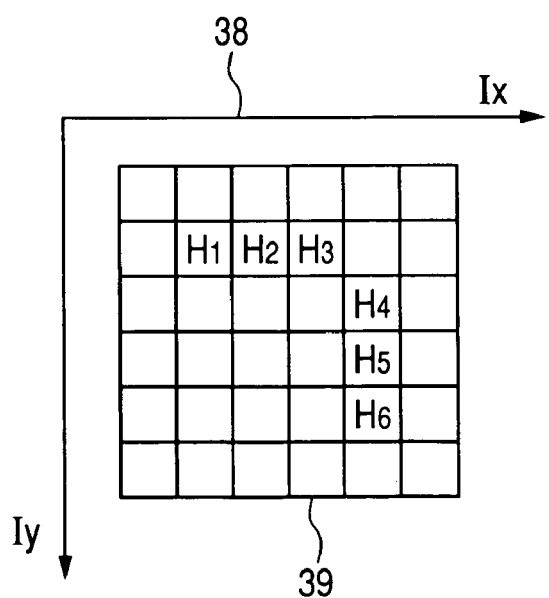
FIG. 2B is a diagram of the obtained image, indicating a pixel corresponding to each irradiated point.

FIG. 2 shows a method for imaging the amount of electron signal emitted from a specimen surface 37 when the specimen 1 (e.g., a semiconductor wafer) is irradiated with an electron beam. As shown in FIG. 2A, the deflector 6 causes the electron beam to scan the specimen surface in the X-direction (as indicated by reference numerals 31 to 33) or in the Y-direction (as indicated by reference numerals 34 to 36), for example. Thus, the scanning direction can be changed by changing the direction in which the electron beam is deflected by the deflector 6. Reference numeral $G_1$ to $G_3$ denote the points on the specimen irradiated with the electron beams 31 to 33, respectively, in the X-direction. Likewise, reference numerals $G_4$ to $G_6$ denote the points on the specimen irradiated with the electron beams 34 to 36, respectively, in the Y-direction. The brightness (grayscale) values of pixels $H_1$ to $H_6$ in an image 39 shown in FIG. 2B correspond to the amounts of electron signal emitted from the points $G_1$ to $G_6$, respectively. Reference numeral 38 denotes a coordinate system indicating the X- and Y-directions in the image 39.

The processing/control unit 15 in FIG. 1 is a computer system for performing processing/control to calculate the three-dimensional profile of a target pattern on the semiconductor wafer 1 based on an observed image of the pattern through image processing or to send control signals to stage controller 20 or the deflection controller 21. Further, the processing/control unit 15 has a display 16 connected thereto which displays a GUI (Graphical User Interface) for showing images to the user. The processing/control unit 15 also includes input means 23 (a keyboard, a mouse, a storage medium, a network, etc.). A storage device 19 is connected to the processing/control unit 15. Reference numeral 17 denotes the X-Y stage for moving the semiconductor wafer 1 in the X- or Y-direction, allowing the system to obtain an image of any point on the semiconductor wafer 1. Even though FIG. 1 shows the two reflected electron image detectors 10 and 11, any number of reflected electron image detectors may be employed.

It should be noted that the CPU 152 functions as the following units: an imaging planning unit 1521 including a tilt image obtaining section and an image selecting section; a segmentation planning unit 1522 including a region determining section and a region extracting section; a slope calculating unit 1523; and a profile calculating unit 1524. When a SE (secondary electron) image of a specimen is to be obtained, the imaging planning unit 1521 plans the tilt angle control amounts required to set appropriate observation directions for the flat regions and sidewall regions of the specimen, etc. and further plans how to select the SE images obtained from the appropriate observation directions for the flat and sidewall regions. The segmentation planning unit 1522 plans how to divide (segment) the SE image detected by the secondary electron detector 9 into segments and extract some of them. The slope calculating unit 1523 calculates the slop (surface inclination angle) as shown by the sidewall inclination angle θ to the incident direction of the electron beam based on the SE image detected by the secondary electron detector 9. The profile calculating unit 1524 integrates slopes calculated by the slope calculating unit 1523 in the cross-sectional direction to produce a three-dimensional profile. The profile calculating unit 1524 may segment calculated three-dimensional profiles and connect some of the segments as necessary. Further, the slope calculating unit 1523 and the profile calculating unit 1524 constitute a profile measuring unit, which in turn constitutes a profile combination unit for combining a plurality of three-dimensional profiles.

Figure 3:
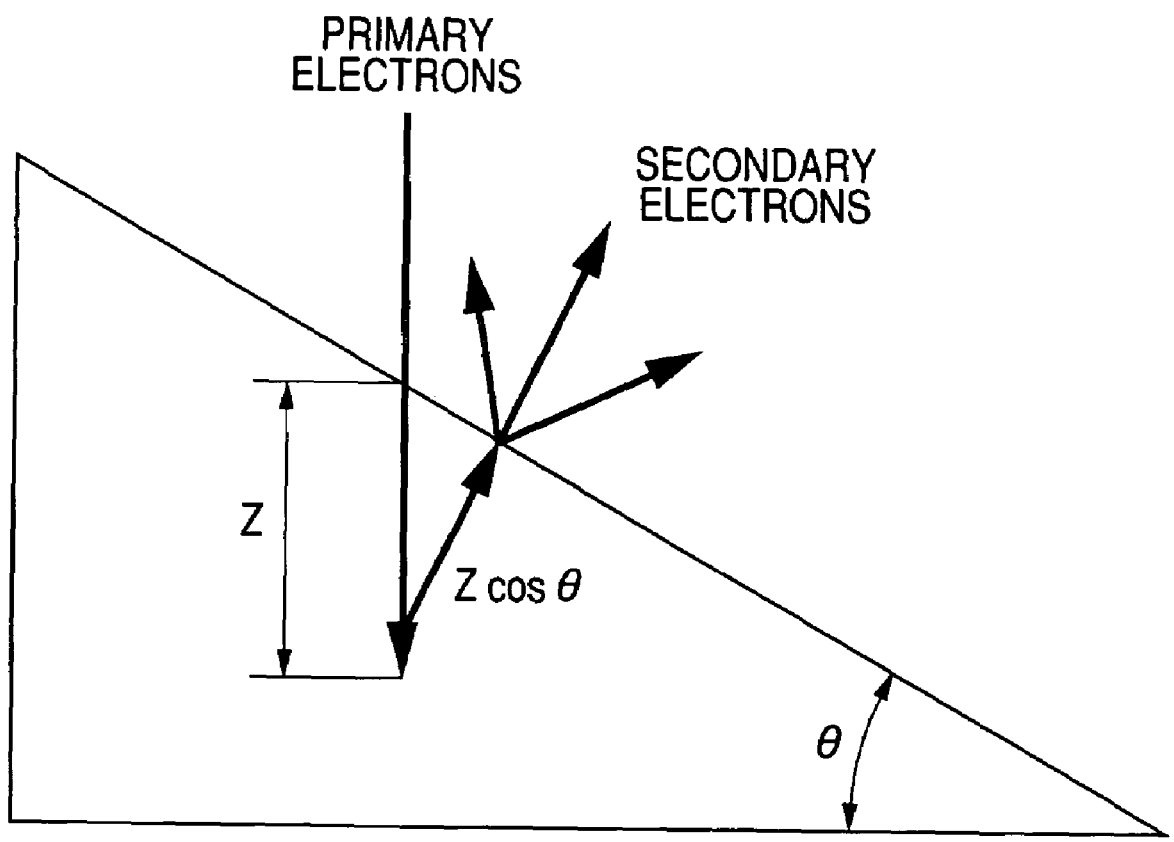
FIG. 3 is a diagram illustrating the relation of the emission amount of secondary electron signal that depends on the inclination angle θ of the slope according to the present invention.

When the specimen 1 is irradiated with a focused primary electron beam so that incident direction φ(0) is formed at (90−θ) degrees to the slope of the specimen, as shown in FIG. 3, the quantity of secondary electrons emitted from a point at the depth Z is expressed by expression (1) or (2) below.

$$I_s(X) = kI_0(1/\cos^n \theta(X)) \quad (1)$$

$$\delta(\theta) = \delta_0 \cdot (1/\cos(\theta)) \quad (2)$$

where: $I_s(x)$ and $\delta(\theta)$ denote the quantity of secondary electrons emitted when the sidewall inclination angle of the specimen is θ; k, the reflectance; $I_0$, the intensity of the primary electron beam; $kI_0$ and $\delta_0$, the quantity of secondary electrons emitted when the sidewall inclination angle is 0 degrees; and n, a coefficient for approximating the actual relationship between the quantity of secondary electrons and the sidewall inclination angle θ well.

Figure 4:
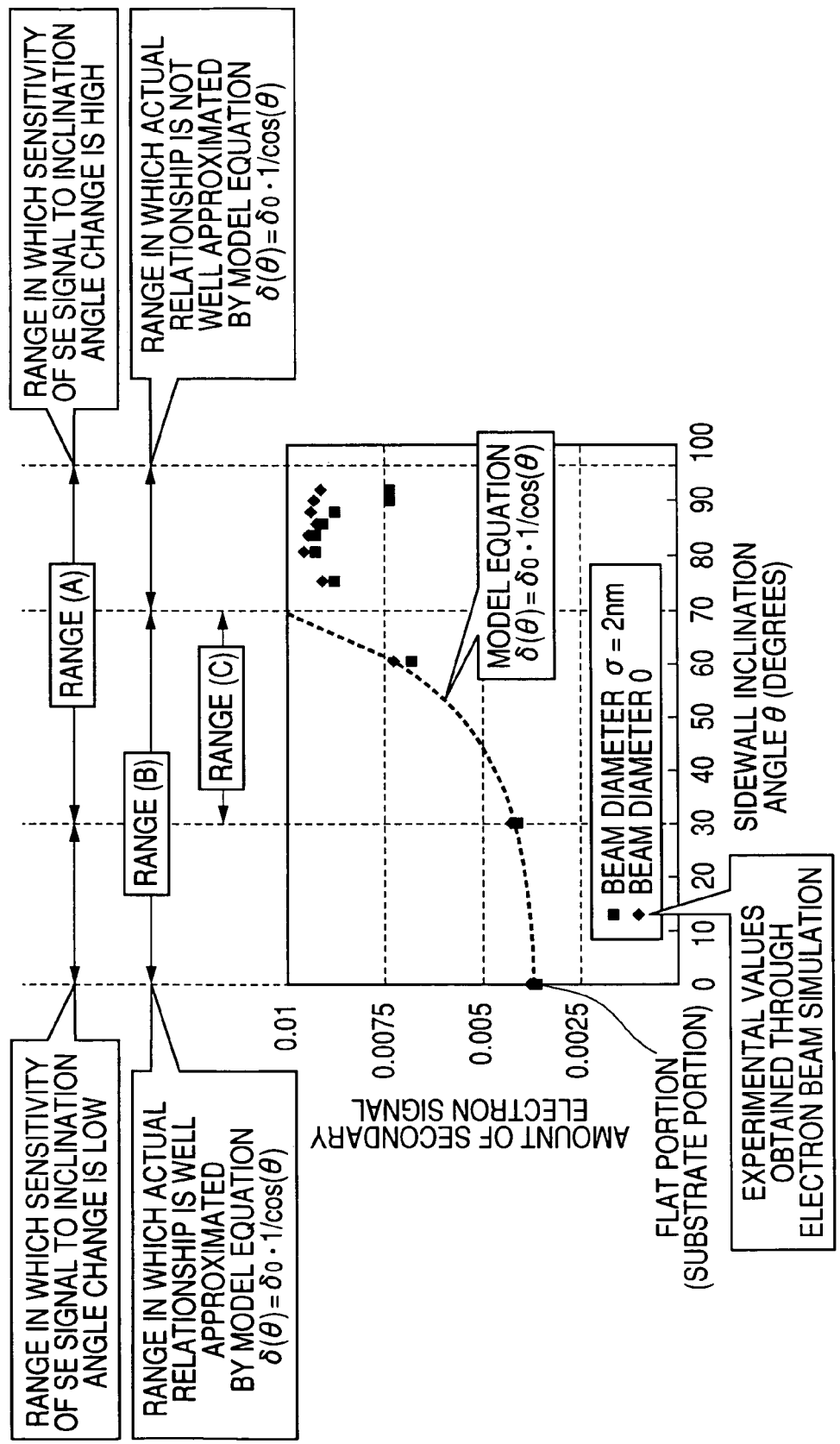
FIG. 4 is a diagram showing the relationship between a sidewall inclination angle θ (degrees) and the amount of secondary electron signal obtained experimentally under imaging conditions according to the present invention.
Figure 5:
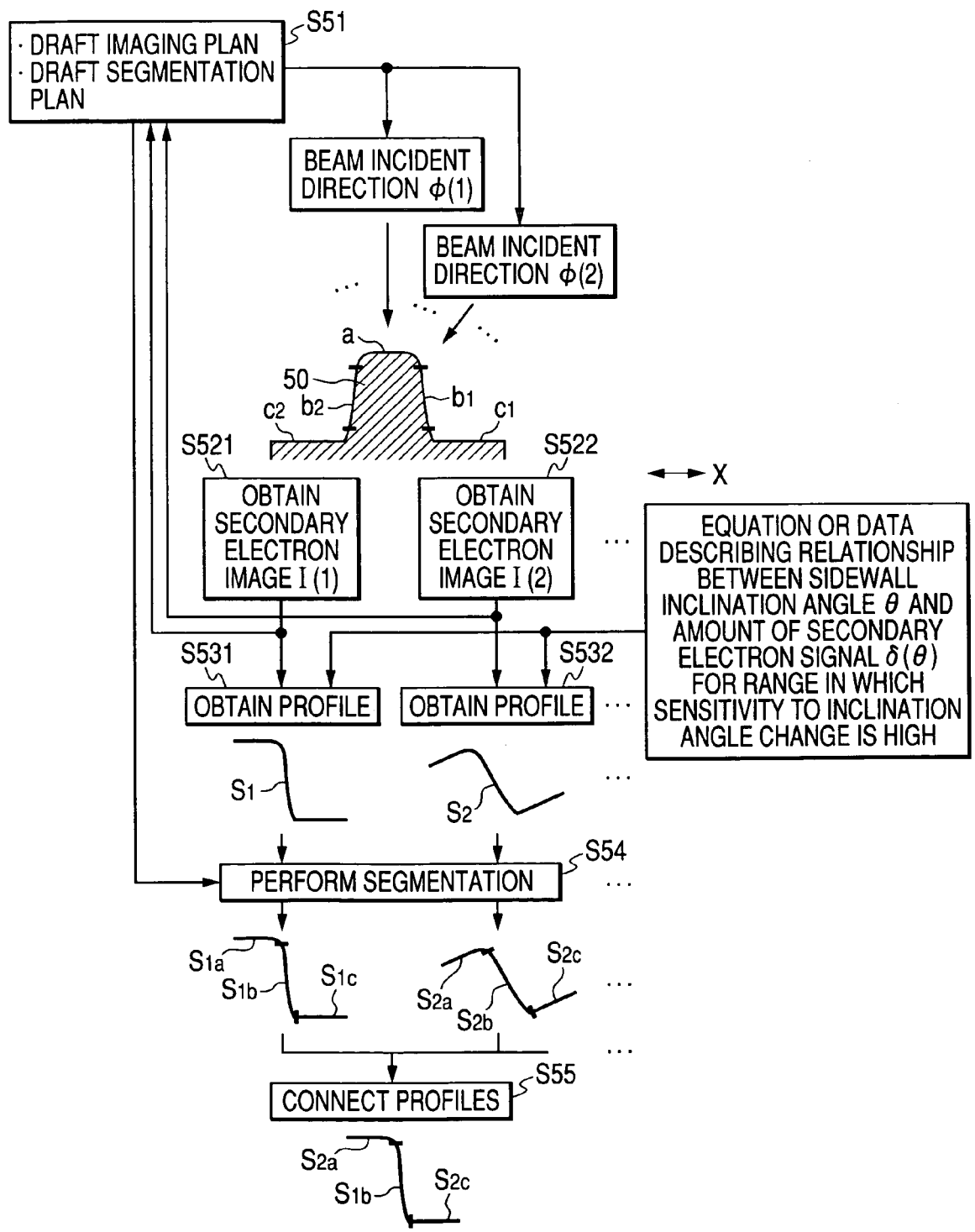
FIG. 5 is a diagram illustrating a method for measuring the three-dimensional profile of a pattern according to a first embodiment of the present invention.

In FIG. 4, the dotted line represents a relationship between the slope of a target surface (plotted on the horizontal axis) and the amount of SE signal (plotted on the vertical axis) calculated from expression (2), while the symbols ■ and ♦ indicate a relationship obtained through an electron beam simulation. When the simulation results are considered to better approximate the actual relationship, this is in finding to mean that the model represented by expression (2) cannot approximate the actual relationship well when the sidewall inclination angle θ is close to 90 degrees. On the other hand, when the sidewall inclination angle θ is approximately between 30 degrees and 70 degrees, the above expression (2) can approximate the actual relationship well, as shown in FIG. 4. Furthermore, the change in the amount of SE (secondary electron) signal per unit change in the inclination angle is large (that is, the sensitivity of SE signal to the inclination angle change is high) in this inclination angle range 30–70 degrees. However, when the sidewall inclination angle θ is less than 30 degrees (corresponding to a flat region or a substrate region), the change in the amount of SE signal is very small (that is, the sensitivity of SE signal to the inclination angle change is low) though the above expressions (1) and (2) can approximate the actual relationship well.

That is, in FIG. 4, the range (A) roughly corresponds to the range in which the sensitivity (the amount) of the SE signal to the inclination angle change is high; and the range (B) roughly corresponds to the range in which the above model approximates the actual relationship between the inclination angle and the amount of SE signal well. It should be noted that whether or not the model expression (2) approximates the actual relationship well is determined based on the assumption that the electron beam simulation results indicated by the symbols ■ and ♦ correspond to the actual relationship. The range (C), which is the overlap between the ranges (A) and (B), is suitable for estimating the slope. Therefore, the tilt image such that this range (C) can be used to presume the slope of the three-dimensional profile is selected as much as possible.

To approximate the relationship between the inclination angle and the amount of SE signal, the example in FIG. 4 uses the model expression: the amount of SE signal=$\delta_0 \cdot (1/\cos(\theta))$, as described above. However, the present invention is not limited to this particular model expression. It is possible to use the model expression indicated in Japanese Laid-Open Patent Publication No. 2000-146558 or directly use the electron beam simulation results shown in FIG. 4. Since model shape of relationship between the amount of SE signal and the sidewall inclination angle changes by selecting model expression or by how to give different parameter values to the model expression., the range (A) in which the sensitivity (amount) of SE signal to the inclination angle change is high and the range (B) in which the model approximates the actual relationship well (shown in FIG. 4) will change. Therefore, the range (C) in FIG. 4 approximately between 30 degrees and 70 degrees is by way of example only.

The present invention is characterized by the steps of: scanning the surface of a specimen with an electron beam incident on the surface at an angle within the range in which the sensitivity of SE signal to inclination angle change is high and the model expression can be well approximated to the actual relationship between the inclination angle and the amount of SE signal is well approximated; detecting the amount of secondary signal emitted from each point on the surface as a result of the scanning; presuming (calculating) the inclination angle (or the slope) at each point on the surface based on the detected amount of SE signal; and obtaining three-dimensional information by integrating the presumed slope at each point along the surface. This makes it possible to accurately measure the three-dimensional profiles of the patterns (line widths, etc.) and contact holes formed on a specimen and thereby detect process variations, allowing the process to be reliably controlled.

With reference to the accompanying drawings, there will now be described methods for obtaining a SE image of a specimen by use of an SEM and measuring its three-dimensional profile based on the obtained image according to preferred embodiments of the present invention.

First, a first embodiment of the present invention will be described with reference to FIGS. 1 and 4 to 8. The imaging planning unit 1521 implemented by the CPU 152 within the processing/control unit 15 drafts an imaging plan to perform tilt control so as to change the incident angle of the electron beam (with respect to a pattern 50 on the specimen 1 to be measured) stepwise in a clockwise or counter-clockwise direction, as indicated by an arrow 61 in FIG. 6 (step S51). It goes without saying that the incident direction of the electron beam may be three-dimensionally changed.

There are three methods for performing the above tilt control: (i) the beam tilting method, (ii) the stage tilting method, and (iii) the lens-barrel tilting method. The beam tilting method deflects the electron beam emitted from the electron optical system to change the incident angle of the electron beam so as to obtain an image of the specimen as observed obliquely (see, e.g., Japanese Patent Laid-Open No. 2000-348658). The obtained image is referred to as "beam tilt image". The stage tilting method tilts the stage 17 itself, which is used to move the semiconductor wafer 1 (note that in FIG. 1, the stage is tilted the tilt angle 18). The image obtained by this method is referred to as "stage tilt image". The lens-barrel tilting method mechanically tilts the electron optical system itself. The obtained image is referred to as "lens-barrel tilt image".

Figure 6:
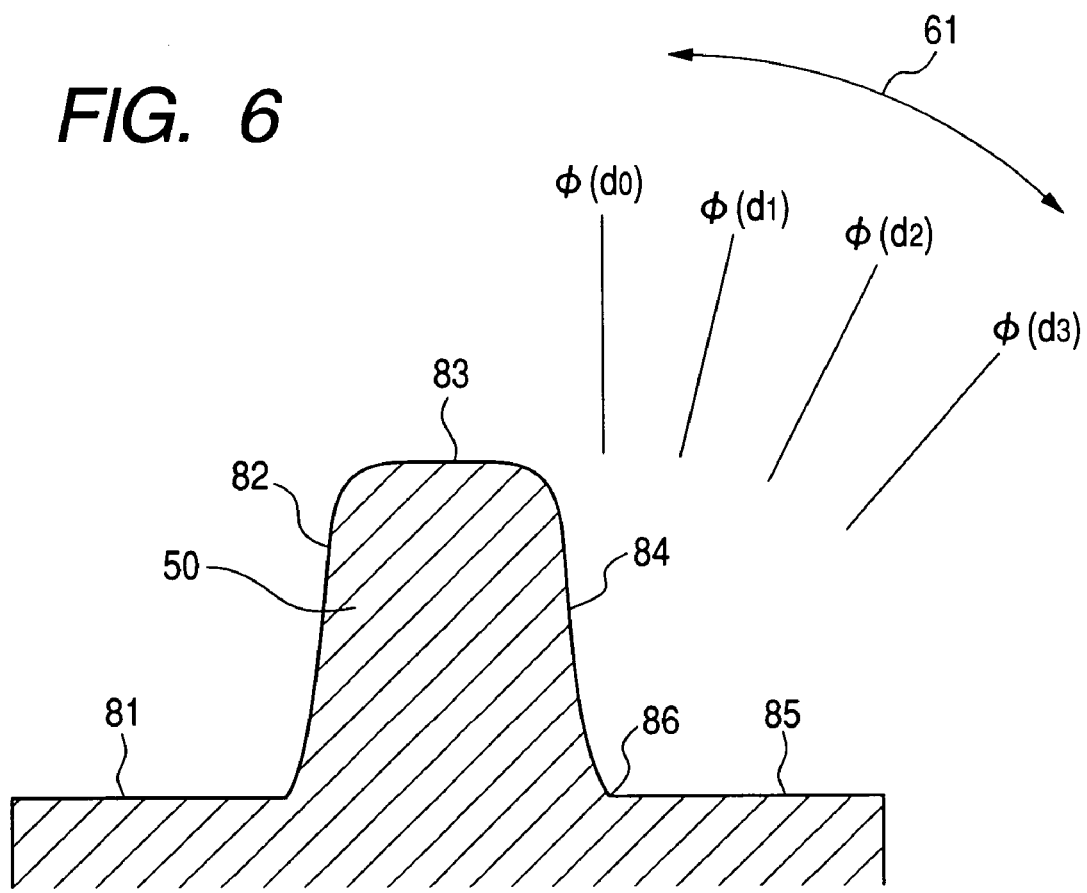
FIG. 6 is a diagram illustrating how a focused electron beam is tilted to change its incident radiation to an observation point according to the first embodiment of the present invention.

Then, the pattern 50 to be measured is scanned with primary electron beams incident on the pattern 50 at a series of different directions (that is, changing the electron beam incident direction stepwise in a clockwise direction, for example) as indicated by $\phi(d0)$, $\phi(d1)$, $\phi(d2)$, $\phi(d3)$ . . . in FIG. 6. The amounts of SE (secondary electron) signal emitted from the pattern 50 to be measured are detected by the secondary electron detector 9 and then A/D converted by the A/D converter 12 into gray scale values to generate SE images I(d0), I(d1), I(d2), I(d3), . . . . The SE images are stored in the image memory 151. Then, the pattern 50 to be measured is also scanned with primary electron beams incident on the pattern 50 at another series of different directions (that is, changing the electron beam incident direction stepwise in a counter-clockwise direction, for example). The amounts of SE signal emitted from the pattern 50 are detected by the secondary electron detector 9 and then A/D converted by the A/D converter 12 into gray scale values to generate SE images, which are then stored in the image memory 151.

Then, the segmentation planning unit 1522 may select the SE image I(d0), which is obtained when the incident direction of the beam is $\phi(d0)$ (close to 0 degrees) corresponding to an incident direction nearly normal to the flat regions, and based on this SE image, draft a segmentation plan by extracting at least regions a and c1 (that allow for only obtaining a SE image with pixel values which correspond to an amount (sensitivity) of SE signal smaller than a predetermined amount) and regions b1 and b2 (that allow for obtaining a SE image with pixel values which correspond to an amount (sensitivity) of SE signal larger than a predetermined amount) at step S51. Or alternatively, the segmentation planning unit 1522 may draft a segmentation plan after determining (or selecting) an electron beam incident direction (observation direction) $\phi(1)$ suitable for the sidewall region b1 and obtaining a SE image I(1) at this angle at step S521 or after determining (or selecting) an electron beam incident direction (observation direction) $\phi(2)$ suitable for the flat regions a and c1 and obtaining a SE image I(2) at this direction at step S522. In such a case, the segmentation planning unit 1522 extracts regions allowing for high sensitivity from three-dimensional profiles S1 and S2 obtained based on the SE images I(1) and I(2), respectively. It should be noted that instead of the segmentation planning unit 1522, the imaging planning unit 1521 may select the electron beam incident direction $\phi(1)$ suitable for the sidewall region b1 and the electron beam incident direction $\phi(2)$ suitable for the flat regions a and c1.

Figure 7:
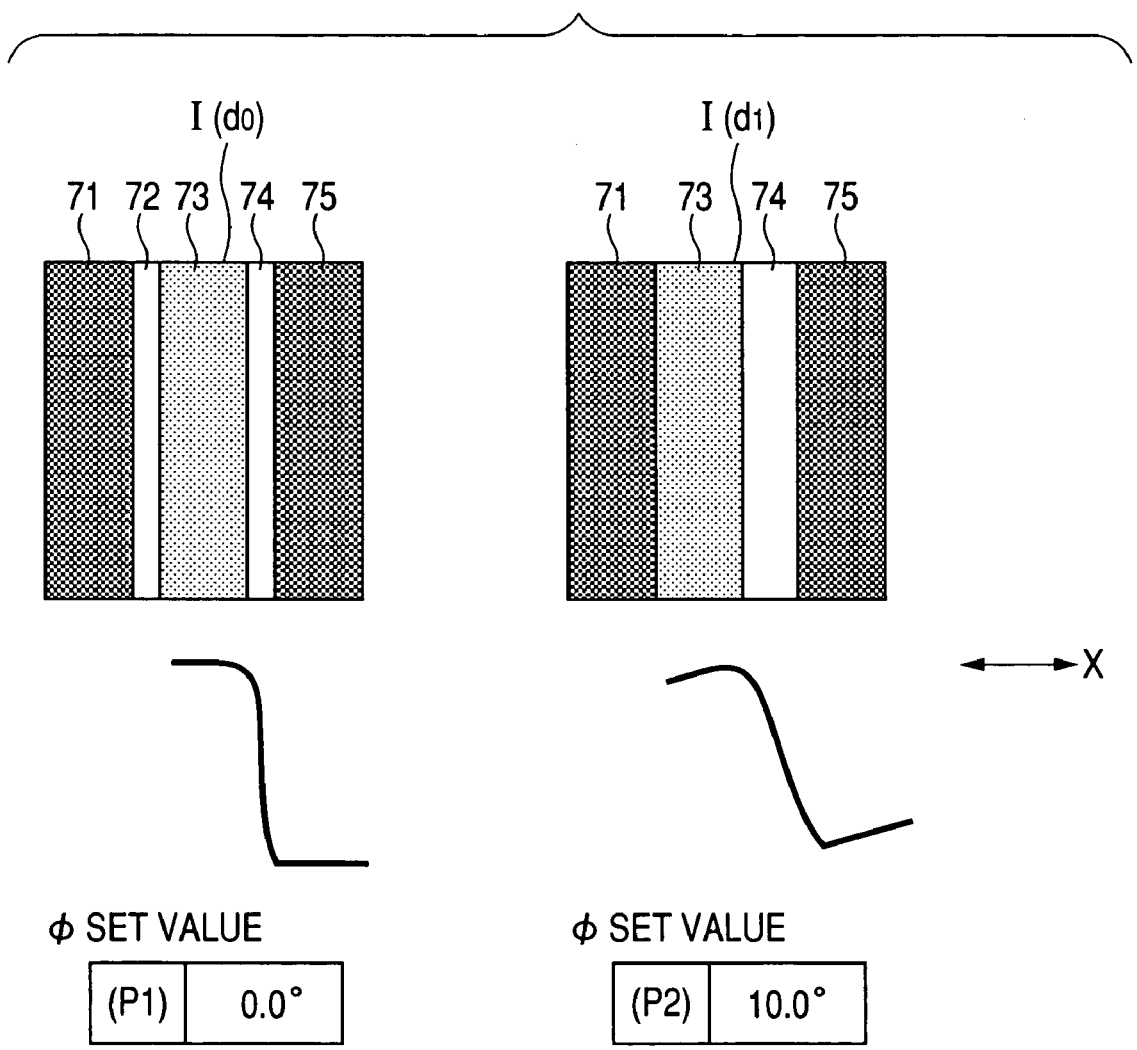
FIG. 7 is a diagram showing changes of secondary electron images detected by a secondary electron detector when the focused electron beam is swung as shown in FIG. 6.

However, generally, it is not possible to determine whether the slope of a pattern sidewall is positive or negative based on an obtained image (that is, for example, it is not possible to determine whether an obtained slope image corresponds to the sidewall b1 on the right or the sidewall b2 on the left). To address this problem, the segmentation planning unit 1522 may retrieve from the image memory 151 the SE images obtained as a result of changing the incident direction $\phi$ of the electron beam from $\phi(d0)$ in a clockwise direction and serially compare one image with another. If the width of the same bright portion (which has received a large amount of SE signal) in each successive image increases (extends), then it can be identified that this bright portion corresponds to the right sidewall surface b1 in the SE image I(d0), as shown in FIG. 7. Further, the segmentation planning unit 1522 may retrieve the SE images obtained as a result of changing the incident direction φ of the electron beam from φ(d0) in a counter-clockwise direction and serially compare one image with another. If the width of the same bright portion (which has received a large amount of SE signal) in each successive image increases (extends), then it can be identified that this bright portion corresponds to the left sidewall surface b2 in the SE image I(d0). In this way, it is possible to determine whether the slope of each surface of the pattern 50 to be measured is positive or negative and roughly determine (presume) the three-dimensional profile of the pattern 50. The determined three-dimensional profile is then stored in the storage device 19.

Further, the segmentation planning unit 1522 or the imaging planning unit 1521 determines (calculates) an incident direction (an observation direction) φ(1) of the electron beam to reduce the tilt angle (φ(1)−φ(0)) which about the sidewall region b1, an amount of SE signal indicates a value (brightness value) lowered a predetermined value more than the maximum value (which, in FIG. 4, corresponds to the vicinity of upper bound within the range (C) in which the sensitivity of SE signal to inclination angle change is high and the actual relationship between the inclination angle and the amount of SE signal is well approximated) by comparing the plurality of SE images I(d0) to I(d4) in the image memory 151 obtained as a result of changing the incident direction φ of the electron beam stepwise in a clockwise direction, and stores the determined incident direction (the determined observation direction) φ(1) in the storage device 19. The segmentation planning unit 1522 or the imaging planning unit 1521 then selects the SE image I(1) obtained at the beam incident direction φ(1) and stores it in the image memory 151 (step S521).

Further, the segmentation planning unit 1522 or the imaging planning unit 1521 determines (calculates) an incident direction (an observation direction) φ(2) of the electron beam which about the flat regions a and c1, an amount of SE signal indicates a value (brightness value) being larger than a predetermined value (which, for example, in FIG. 4, corresponds to the vicinity of lower bound within the range (C) in which the sensitivity of the SE signal to the inclination angle change is high and the actual relationship between the inclination angle and the amount of SE signal is well approximated) by comparing the plurality of SE images I(d0) to I(d4) in the image memory 151, and stores the determined incident direction (the determined observation direction) φ(2) in the storage device 19. The segmentation planning unit 1522 or the imaging planning unit 1521 then selects the SE image I(2) obtained at the beam incident direction φ(2) and stores it in the image memory 151 (step S522).

Furthermore, the segmentation planning unit 1522 or the imaging planning unit 1521 determines an incident direction (an observation direction) φ(1) of the electron beam to reduce the tilt angle (φ(1)−φ(0)) which about the sidewall region b2, an amount of SE signal indicates a value (brightness value) lowered a predetermined value more than the maximum value (which, in FIG. 4, corresponds to the vicinity of upper bound within the range (C) in which the sensitivity of SE signal to inclination angle change is high and the actual relationship between the inclination angle and the amount of SE signal is well approximated) by comparing the plurality of SE images in the image memory 151 obtained as a result of changing the incident direction φ of the electron beam stepwise in a counterclockwise direction, and stores the determined incident direction φ(1) in the storage device 19. The segmentation planning unit 1522 or the imaging planning unit 1521 then selects the SE image obtained at the beam incident direction φ(1) and stores it in the image memory 151.

Furthermore, the segmentation planning unit 1522 or the imaging planning unit 1521 determines an incident direction (an observation direction) of the electron beam which about the flat regions a and c2, an amount of SE signal indicates a value (brightness value) being larger than a predetermined value (which, in FIG. 4, corresponds to the vicinity of lower bound within the range (C) in which the sensitivity of the SE signal to the inclination angle change is high and the actual relationship between the inclination angle and the amount of SE signal is well approximated) by comparing the plurality of SE images in the image memory 151, and stores the determined incident direction in the storage device 19. The segmentation planning unit 1522 or the imaging planning unit 1521 then selects the SE image obtained at the beam incident direction and stores it in the image memory 151.

On the result, the segmentation planning unit 1522 or the imaging planning unit 1521 determines (calculates) the incident directions (the observation directions) of the electron beam which the detection sensitivity of the SE signal is raised and the approximation of the model expression is improved to the actual relationship to the above sidewall regions b1 and b2 and the above flat regions a, c1, and c2, and stores the determined incident directions (the determined observation directions) in the storage device 19. Furthermore, the segmentation planning unit 1522 or the imaging planning unit 1521 selects the SE images obtained at these incident directions and stores them in the image memory 151.

That is, the segmentation planning unit 1522 or the imaging planning unit 1521 determines an observation direction φ(2) which the amount of the SE signal generated from the flat regions a and c1 (which in the pattern to be measured, the sensitivity of the SE signal to inclination angle change is low) can be obtained more than the predetermined value, scans at least the regions a and c1 with a focused electron beam incident on these regions at the determined direction φ(2), detects the amount of SE image signals generated (emitted) as a result of the scanning to obtain a tilt SE image I(2) including tilt SE images of the above regions a and c1, and stores them in the image memory 151 (step S522).

Incidentally, the segmentation planning unit 1522 or the imaging planning unit 1521 drafts an imaging plan to positively use the model expression of the vicinity of the range (C) in FIG. 4 in which the sensitivity and the approximation are good. However, because the settable tilt angles vary depending on the tilting method or apparatus, it is not always possible to observe from an observation direction using the model expression of the range (C). In this case, the segmentation planning unit 1522 or the imaging planning unit 1521 drafts an imaging plan for selecting a range in which the sensitivity and the approximation of the model expression are as good as possible, as the observation direction. Moreover, the segmentation planning unit 1522 or the imaging planning unit 1521 is possible to consider an imaging plan so that the number of imaging sheets can be decreased and the throughput of the measurement can be improved by selecting an observation direction in each measurement region which has comparatively excellent sensitivity and approximation and is typical, effective observation direction even if it is not the optimum observation direction.

Further, the segmentation planning unit 1522 or the imaging planning unit 1521 (constituting the region determining unit) determines the flat regions a and c1 on the pattern which allow for only low sensitivity to inclination angle change based on the amounts of SE signal in the normal SE image I(d0) obtained as a result of scanning the pattern with a focused electron beam incident on the pattern at the normal incident direction φ(d0). Then, the imaging planning unit 1521 (constituting the tilt image capturing unit) scans at least the determined regions a and c1 with an electron beam incident on these regions a and c1 at an incident direction φ(2) tilted a predetermined angle to the normal incident direction φ(d0), and detects the amount of SE signal emitted as a result of the scanning to obtain a tilt SE image I(2) including tilt SE images of the regions a and c1. Then, the profile measuring unit 1523 presumes and calculates the slope at each coordinate point on the above regions based on the amount of SE signal at the each coordinate point in the obtained tilt SE image of the regions and integrates successively the calculated slope presumption value at each coordinate point to measure three-dimensional profiles S2$a$ and S2$c$ of the regions a and c1.

It should be noted that when an electron beam is radiated to the pattern shown in FIG. 6 having a convex cross-sectional shape from the incident direction φ(2), as described above, the beam is blocked from reaching the flat region c2 by the convex portion. Therefore, the electron beam must also be radiated from an incident direction approximately symmetrical to the incident direction φ(2) on the other side.

Figure 8A:
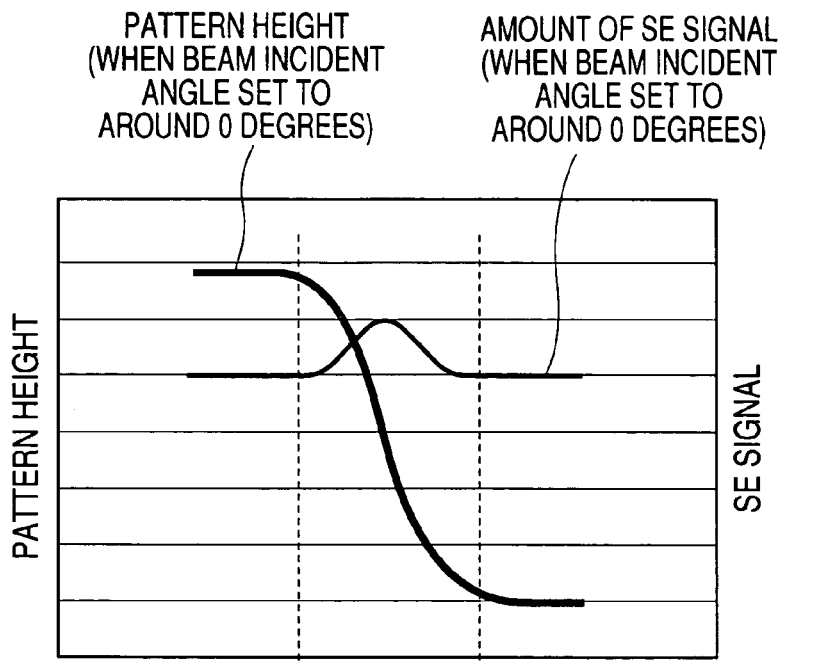
FIG. 8A is a diagram showing the relationship between pattern height and the amount of SE signal with the stage tilt angle (or the beam tilt angle) set to around 0 degrees according to the present invention.
Figure 8B:
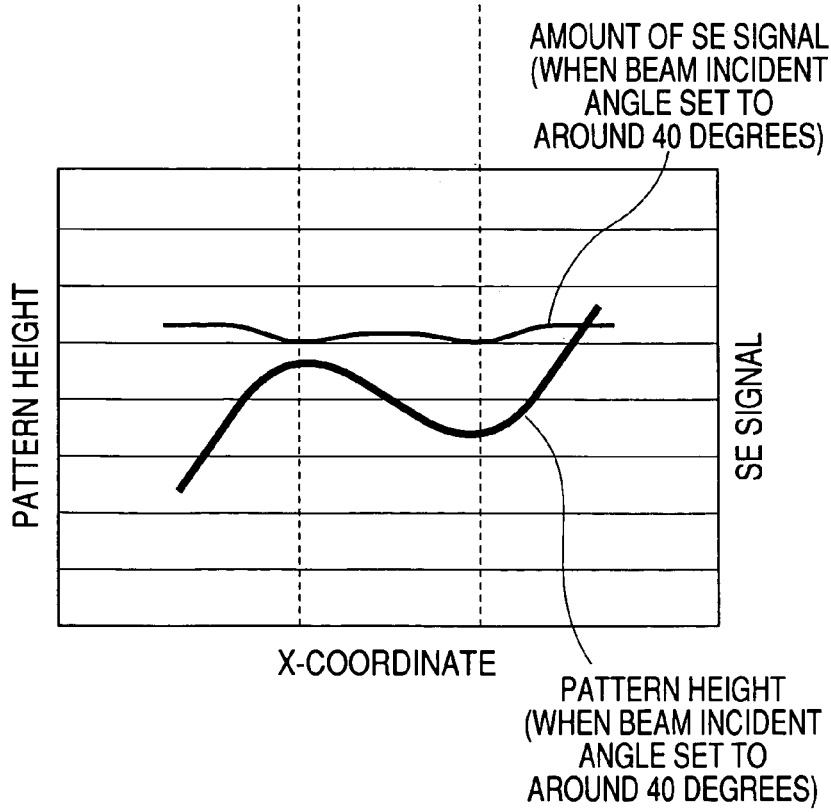
FIG. 8B is a diagram showing the relationship between pattern height and the amount of SE signal with the stage tilt angle (or the beam incident angle) set to around 40 degrees according to the present invention.

FIG. 8A shows a result presumed an amount of SE signal being detected by the secondary electron detector 9 by using the above expression (2) when the electron beam is radiated from the incident direction φ(1) to the sidewall region b1 about the height of a pattern (cross-sectional profile) shown in FIG. 8A, the beam incident direction φ(1) being approximately 0 degrees, and having high sensitivity for the sidewall region b1. FIG. 8B, on the other hand, shows a result presumed an amount of SE signal being detected by the secondary electron detector 9 by using the above expression (2) when the electron beam is radiated from the beam incident direction φ(2) to the flat regions a, c1, and c2 about the same height of the pattern as FIG. 8A shown in FIG. 8A, the incident direction φ(2) being approximately 40 degrees, and having high sensitivity for the flat regions a, c1, and c2.

Moreover, It is necessary to be measured the relationship between the sidewall inclination angle θ and the amount of SE signal δ(θ) that can be approximated by the above expression (1) or the above expression (2) as shown in FIG. 4, by using the test pattern of already-known shape as shown in FIG. 3 which is manufactured so as to match to the kind (that reflectivity etc. are different) of the material etc. of the pattern to be measured, the relationship being a value of $δ_0$ in the above approximate expression (1) or values of $kI_0$ and n in the above approximate expression (2), and to store the relationship in the storage device 19 beforehand. That is, as shown in FIG. 4, the relationship between the sidewall inclination angle θ and the amount of SE signal δ(θ) is evaluated (measured) while studying according to the kind of the material etc. to store in the storage device 19 beforehand. Thus, by evaluating the relationship based on study, the slope calculating unit 1523 can accurately calculate the slope at each coordinate point on the pattern indicated the sidewall inclination angle to the beam incident direction from the amount of SE signal δ(θ) detected by the secondary electron detector 9 based on the relationship between the sidewall inclination angle θ and the amount of SE signal δ(θ) (or based on the above approximate expression (1) or (2)) for the sidewall inclination angle range (approximately between 30 degrees and 70 degrees) in which the sensitivity of SE signal to the inclination angle change is high.

The slope calculating unit 1523 calculates the slope (or surface inclination angle) at each coordinate point on the pattern indicated the sidewall inclination angle θ to the beam incident direction θ(1) by back-calculating based on the relationship (shown in FIG. 4) stored in the storage device 19 (or based on the above approximate expression (1) or (2)) from the SE image I(1) stored in the image memory 151 and stores the calculated slope value in the storage device 19 or the image memory 151 as necessary. Then, the profile calculating unit 1524 integrates successively the slope (or surface inclination angle) at each coordinate point in a cross-sectional direction (e.g., in the X-direction) to measure a three-dimensional profile S1 (indicated by a solid line in the figure), which is then stored in the storage device 19 or the image memory 151 (step S531).

Furthermore, the slope calculating unit 1523 also calculates the slope (or surface inclination angle) at each coordinate point on the pattern indicated the sidewall inclination angle θ to the beam incident direction φ(2) by back-calculating based on the relationship (shown in FIG. 4) stored in the storage device 19 (or based on the above approximate expression (1) or (2)) from the SE image I(2) stored in the image memory 151 and stores the calculated slope value in the storage device 19 or the image memory 151 as necessary. Then, the profile calculating unit 1524 integrates successively the slope (or surface inclination angle) at each coordinate point in a cross-sectional direction (e.g., in the X-direction) to measure a three-dimensional profile S2 (indicated by a solid line in the figure), which is then stored in the storage device 19 or the image memory 151 (step S532).

It should be noted that to integrate successively the slope at each coordinate point on the sidewall surfaces, the profile calculating unit 1524 must know whether the slope is positive or negative. However, since the storage device 19 stores a three-dimensional profile roughly estimated by the segmentation planning unit 1522 which indicates whether the slope of each sidewall surface is positive or negative, the profile calculating unit 1524 can integrate successively the slope at each coordinate point by using this rough profile data.

It should be further noted that instead of the profile calculating unit 1524, the slope calculating unit 1523 may integrate successively the slope at each coordinate point at each of the beam incident directions (the observation directions) φ(1) and φ(2) to measure the three-dimensional profiles S1 and S2.

Then, the profile calculating unit 1524 segments the three-dimensional profiles S1 and S2 stored in the storage device 19 or the image memory 151 into profiles S1$a$, S1$b$, S1$c$ S2$a$, S2$b$, and S2$c$ according to the segmentation plan. It should be noted that according to the segmentation plan, the profiles S1$b$, S2$a$, and S2$c$ are measured with high sensitivity to the inclination angle change.

Therefore, the profile calculating unit 1524 connects the profiles S2$a$ and S2$c$ to respective ends of the profile S1$b$ after rotating the profiles S2$a$ and S2$c$ in such a way to compensate for the difference between their beam incident direction φ(2) and the beam incident direction φ(1) of the profile S1$b$, allowing the three-dimensional profile of the pattern to be accurately measured (step S55). The connected profile may be output to a GUI screen. Alternatively, it may be output to a storage device, or to another apparatus through a network.

Figure 9A:
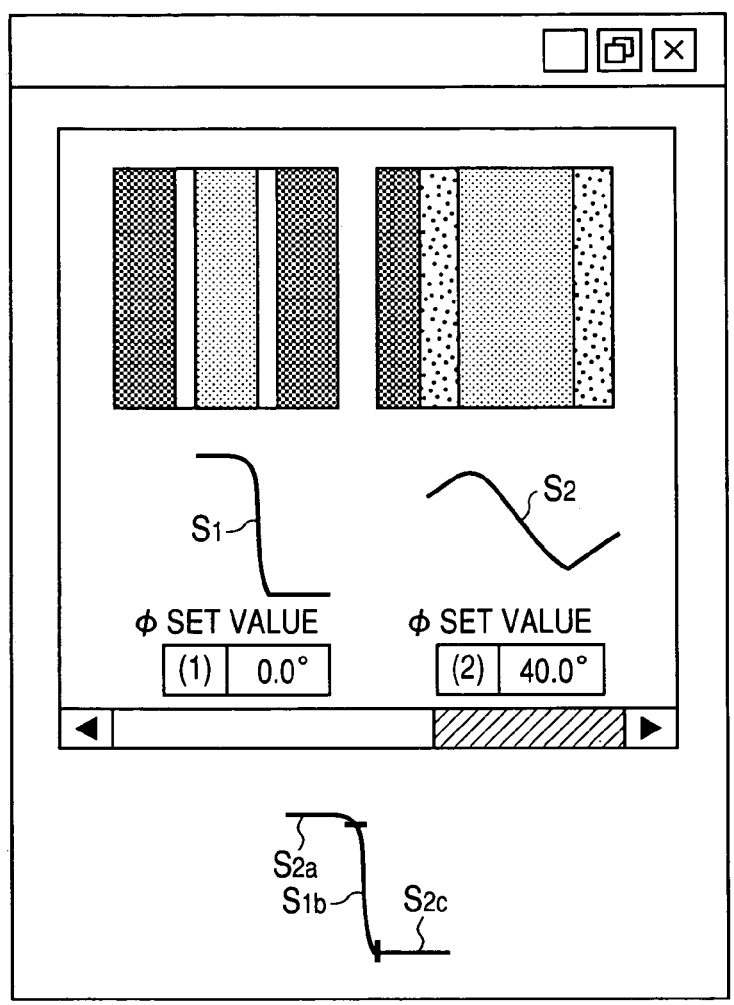
FIG. 9A shows a GUI screen displaying two electron beam images obtained at different beam incident angles φ.
Figure 9B:
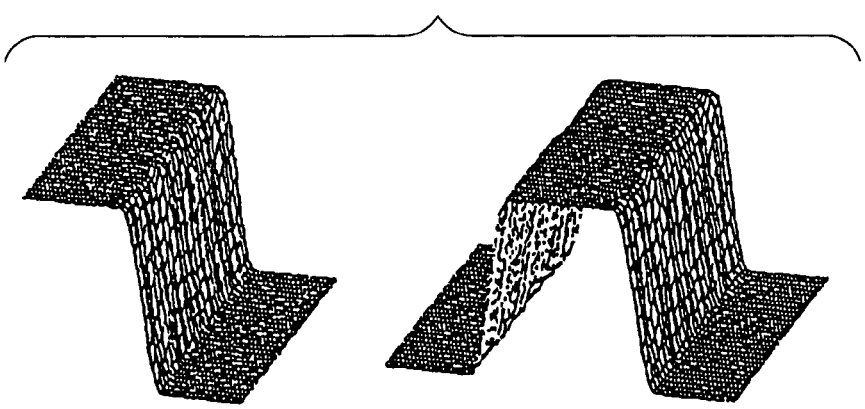
FIG. 9B shows perspective views of a combined three-dimensional profile of the pattern.

FIG. 9A shows a GUI screen displaying: the SE images I(1) and I(2) detected by the secondary electron detector 9 when the beam incident direction are set to φ(1) and φ(2), respectively; the profiles S1 and S2 produced from their respective SE images; and a three-dimensional profile S2*a*-S1*b*-S2*c* of the pattern obtained as a result of connecting (or combining) some portions of the profiles S1 and S2 together. As shown in FIG. 9A, the GUI screen of the present embodiment can display a set of tilt images observed at different tilt angles, as well as a set of two- or three-dimensional profiles calculated from these observed tilt images. Further, the GUI screen can also display a two- or three-dimensional integrated profile obtained as a result of connecting portions of the calculated profiles together, as well as the connection points. (The GUI screen can display some or all of the above images, profiles, and connection points at the same time.) FIG. 9B shows perspective views of the integrated three-dimensional profile S2*a*-S1*b*-S2*c* of the pattern.

It goes without saying that the profiles S2*a*, S1*b*, and S2*c* may be separately displayed on the GUI screen if they need not be combined together.

As described above, the first embodiment is characterized by the steps of: calculating the slope (or the surface tilt angle) at each point on the flat regions a and c1 (which normally allow for only low sensitivity to tilt angle change) based on the tilt SE image I(2) captured at the beam incident angle (or the beam incident direction) φ(2); and integrating successively each calculated slope (or surface inclination angle) to yield the three-dimensional profiles S2*a* and S2*c*. This arrangement allows the three-dimensional profile of the pattern to be accurately measured.

Further, the first embodiment is also characterized by the steps of: determining the flat regions a and c1 (which normally allow for only low sensitivity to tilt angle change) based on the amounts of SE signal of the corresponding portions in the normal SE image I(d0) captured at the normal beam incident angle φ(d0); calculating the slope (or surface tilt angle) at each point on the determined flat regions a and c1 based on the tilt SE image I(2) obtained at a different beam incident angle (or beam incident direction) φ(2); and integrating successively each calculated slope (or surface tilt angle) to measure (yield) the three-dimensional profiles S2*a* and S2*c*.

Further according to the first embodiment, the observation direction (or the beam incident angle or direction) φ(2) is determined by changing the beam incident angle from φ(d0) to φ(d4) with respect to the specimen and selecting a beam incident angle (or beam incident direction) at which the change in the amount of SE signal per unit change in the inclination angle is large and the actual relationship between the inclination angle and the amount of SE signal is well approximated.

Further according to the first embodiment, whether the slope of a surface is positive or negative is determined by obtaining SE images using electron beams incident on the surface at a series of different angles and checking whether the width of the surface image in each successive SE image increases or decreases. This makes it possible to determine whether each slope calculated based on high-sensitivity SE images is positive or negative and to integrate successively each slope to measure an accurate three-dimensional profile.

Further, the first embodiment images (observes) a plurality of images I(d0) to I(d4) when incident angles of electron beams φ(d0) to φ(d4) are changed. Then, the first embodiment is characterized to presume and measure the three-dimensional profiles S2*a* and S2*b* by using the image I(2) in lightening (which for example, in FIG. 4, corresponds to the vicinity of lower bound within the range (C) in which the sensitivity and the approximation are good) about the flat portions. The first embodiment is characterized to further presume and measure the three-dimensional profiles S2*a* and S2*b* by using the image I(1) in darkening (which for example, in FIG. 4, corresponds to the vicinity of upper bound within the range (C) in which the sensitivity and the approximation are good) about the edge portions (or sidewall surface portions).

Figure 10:
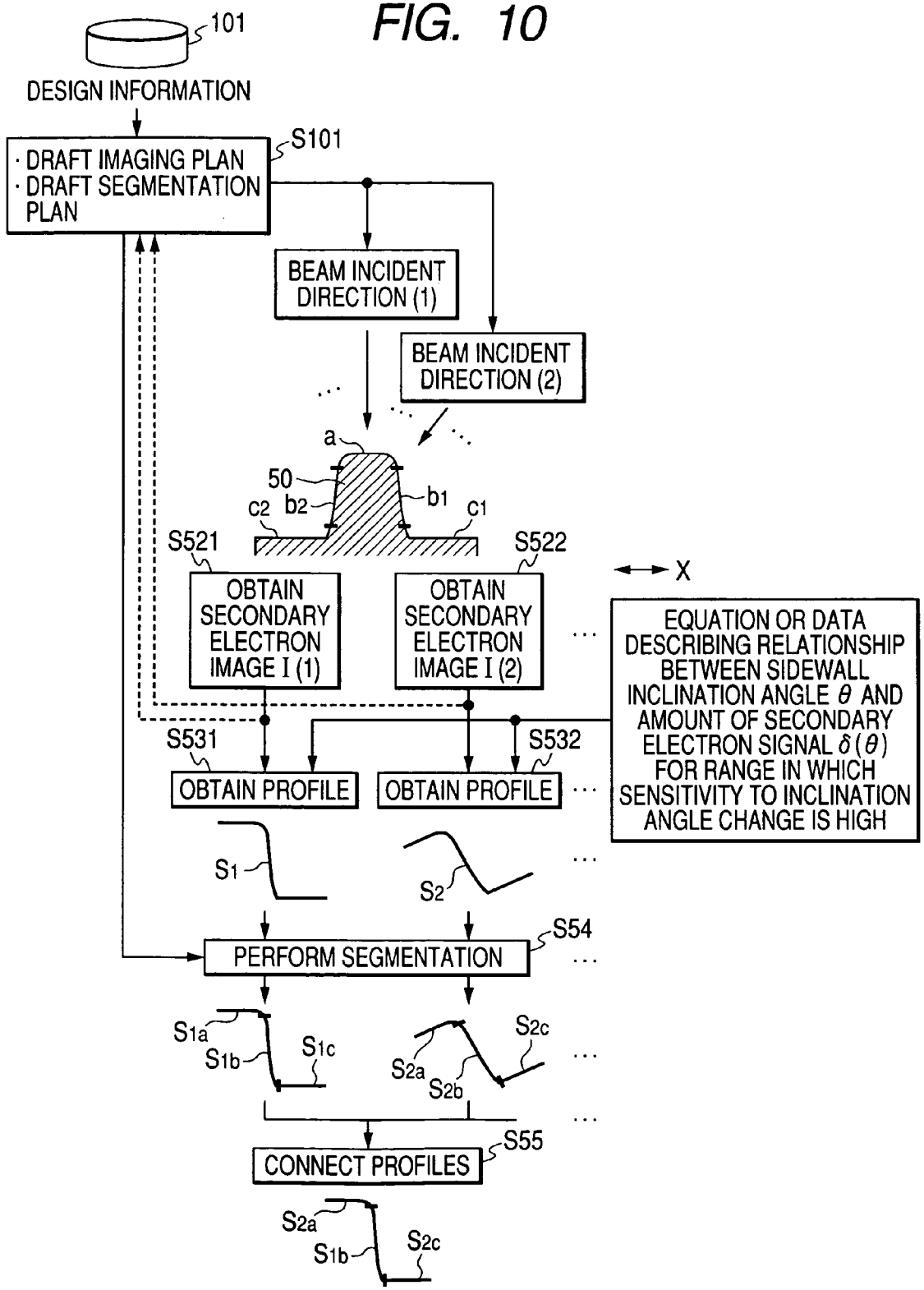
FIG. 10 is a diagram illustrating a method for measuring the three-dimensional profile of a pattern according to a second embodiment of the present invention.

There will now be described a second embodiment of the present invention with reference to FIG. 10, etc. The second embodiment is different from the first embodiment in that the imaging planning unit 1521 (implemented by the CPU 152) within the processing/control unit 15 drafts an imaging plan of a pattern to be measured formed on a specimen using a cross-sectional profile model of the pattern created based on its design information 101 entered through the input means 23 (a storage medium, a network, etc.) and stored in the storage device 19. Specifically, based on such a cross-sectional profile model, the imaging planning unit 1521 determines electron beam incident directions (or observation directions) φ(1) and φ(2) at which the sensitivity to inclination angle change is high and the approximation of the model expression is well and determines tilt angle control amounts (step S101). The electron beam incident direction φ(1) is set to be close to a normal direction such that the sensitivity is high for the sidewall regions b1 and b2, while the electron beam incident direction φ(2) is set to a direction tilted from the normal direction such that the sensitivity is high for the regions approximated to flat portions a, c1, and c2.

The cross-sectional profile model used as a clue to determine the observation direction is given based on (1) design information or other information (prior knowledge), (2) rough measurement results, etc.

The above design information and other information (prior knowledge) will be described. Though some error is included in an actual pattern shape for its design information, it can be expected that a similar level between them is high. Therefore, since the inclination angle range in FIG. 4 in which the sensitivity and the approximately are good, has some range, it is useful to use the design information to presume the slope at each measurement point on a target surface as well as to determine the observation directions. Further, if the CPU 152 can get that the pattern in a line and space is observed for instance as the prior knowledge, then the CPU 152 can presume and segment regions 71 and 75 as substrate portions, regions 72 and 74 as sidewall portions, and region 73 as a pattern top portion in the images I(d0) and I(d1) in FIG. 7. Further, the CPU 152 can presume the slope of each portion of a target pattern with some degree of certainty so that for example, in FIG. 6, substrate portions 81 and 85 and top surface portion 83 have a slope of $0 \pm \Delta_0$ degrees and sidewall portions 82 and 84 have a slope of $90 \pm \Delta_{90}$ degrees by comparing the design information and information on variations in the shapes of previously formed patterns. Further, since a skirt portion 86 defining the boundary between the sidewall and the substrate on the right side is considered to have slopes from 0 degrees to 90 degrees, electron beams may be observed this portion from two incident directions, e.g., approximately 30 degrees (that is, in a nearly vertical direction) and approximately 70 degrees (that is, in a sideways direction), thereby obtaining detailed information on the slope of the target surface. In the CPU 152, this makes it possible to perform more accurate segmentation and recapture an image at a different beam incident direction as necessary.

The above rough measurement results will now be described. An exemplary method for obtaining such rough measurement results observes an SE image at a normal angle of beam incidence (that is, the beam radiates on the specimen from a vertical direction), roughly calculates the slope at each measurement point on the target surface based on the observed SE image, and determines (presumes) the rough observation direction (or rough beam incident direction) required for each measurement point based on the roughly calculated slope. Though it can be expected that a big error is included in the above roughly calculated slope value for a slope value calculated based on an SE image observed at an optimum angle of beam incidence (that is, in an optimum observation direction), since the inclination angle range in FIG. 4 in which the sensitivity and the approximately are good, has some range, it is useful to use the above roughly calculated slope value when the above rough observation direction is determined.

The segmentation planning unit 1522 (implemented by the CPU 152) may draft a segmentation plan to extract low-sensitivity regions from the three-dimensional profiles S1 and S2 measured according to the electron beam incident directions φ(1) and φ(2), respectively, based on the cross-sectional profile model (of the pattern to be measured formed on the specimen) created using the design information 101 stored in the storage device 19 and based on the tilt control amounts (for setting the required electron beam incident directions) determined by the imaging planning unit 1521, and may store the drafted plan in the storage device 19 (step S54). It goes without saying that the segmentation planning unit 1522 may draft a segmentation plan to extract low-sensitivity regions from the measured three-dimensional profiles S1 and S2 based on the secondary electron image I(1) obtained at step S521 or the secondary electron image I(2) obtained at step S522.

As described above, the second embodiment is characterized in that the observation directions (the imaging plan) are determined based on a cross-sectional profile model (design information) beforehand. Further, the second embodiment is also characterized in that the observation directions (the imaging plan) and the segmentation plan are determined based on a cross-sectional profile model (design information) beforehand.

As described above, the first and second embodiments accurately measure the three-dimensional profiles of line widths or contact holes based on an observation SEM image, making it possible to detect process variations and thereby control the process.

The invention may be embodied in other specific forms without departing from the spirit or essential characteristics thereof. The foregoing embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

The invention claimed is:

1. A method for measuring a three-dimensional profile using a SEM, comprising:
    a first secondary electron image obtaining step of scanning a pattern to be measured with a focused electron beam incident on said pattern from a first direction, and detecting secondary electrons emitted from said pattern as a result of said scanning to obtain a first secondary electron image of said pattern;
    a first three-dimensional profile estimating step of estimating a first three-dimensional profile based on the obtained first secondary electron image of the pattern and a determination of an inclination angle of the pattern based upon a previously obtained relationship between an amount of secondary electron signal and an inclination angle of a specimen;
    a second secondary electron image obtaining step of scanning said pattern with a focused electron beam incident on said pattern from a second direction, and detecting secondary electrons emitted from said pattern as a result of said scanning to obtain a second secondary electron image of said pattern;
    a second three-dimensional profile estimating step of estimating a second three-dimensional profile based on the obtained second secondary electron image of the pattern and a determination of an inclination angle of the pattern based upon a previously obtained relationship between the amount of secondary electron signal and an inclination angle of the specimen;
    a step of segmenting the estimated first three-dimensional profile and the estimated second three-dimensional profile into small areas by a slope of the area; and
    a step of estimating a three-dimensional profile of the pattern by selecting the segmented profile which is sensitive to the slope from each of the segmented small areas and reconstructing a three-dimensional profile of the pattern from the selected segmented profiles.

2. The method as claimed in claim 1, wherein:
    said pattern includes a plurality of regions;
    when said pattern is scanned with said focused electron beam incident on said pattern in said first direction, an obtained secondary electron image of one of said plurality of regions exhibits low sensitivity to inclination angle change; and
    when said pattern is scanned with said focused electron beam incident on said pattern in said second direction, an obtained secondary electron image of another one of said plurality of regions exhibits low sensitivity to inclination angle change.

3. The method as claimed in claim 1, wherein said second secondary electron image obtaining step includes the steps of:
    scanning said pattern with focused electron beams incident on said pattern from a series of different directions;
    detecting variations in the amounts of secondary electron signal emitted from said pattern as a result of said scanning from said different beam incident directions;
    estimating variation in the amount of secondary electron signal emitted from the pattern as a result of scanning the pattern with the focused electron beams incident on the pattern from a series of different directions; and
    determining said second direction based on said detected variations in said amounts of secondary electron signal.

4. The method as claimed in claim 1, wherein said second secondary electron image obtaining step includes determining said second direction based on a cross-sectional profile model of said pattern.

5. The method as claimed in claim 1, wherein said step of calculating said three-dimensional profile of said pattern includes the steps of:
    obtaining information on slope of a surface of a first region on said pattern based on said first secondary electron image of said pattern obtained at said first secondary electron image obtaining step;
    obtaining information on slope of a surface of a second region on said pattern based on said second secondary electron image of said pattern obtained at said second secondary electron image obtaining step; and calculating said three-dimensional profile of said pattern based on said obtained information on said slope of said surface of said first region on said pattern and said obtained information on said slope of said surface of said second region on said pattern.

6. The method as claimed in claim 5, wherein:

said second region includes a sidewall surface of said pattern; and said step of calculating said three-dimensional profile of said pattern includes obtaining said information on said slope of said surface of said second region by calculating the slope at each point on said second region based on the amount of secondary electron signal emitted from each point on said pattern by using a previously studied relationship between a sidewall inclination angle and the amount of secondary electron signal.

7. An apparatus for measuring a three-dimensional profile, comprising:

a table on which a specimen is placed, said specimen having thereon a pattern to be measured;

a first secondary electron image obtaining means which scans said pattern of said specimen on said table with a focused electron beam incident on said pattern from a first direction, and detects secondary electrons emitted from said pattern as a result of said scanning to obtain a first secondary electron image of said pattern;

a second secondary electron image obtaining means which scans said pattern of said specimen on said table with a focused electron beam incident on said pattern from a second direction, and detects secondary electrons emitted from said pattern as a result of said scanning to obtain a second secondary electron image of said pattern; and a processing means which estimates a first three-dimensional profile based on the obtained first secondary electron image of the pattern and determines an inclination angle of the pattern based upon a previously obtained relationship between an amount of secondary electron signal and an inclination angle of the specimen, and determines a second three-dimensional profile based on the obtained second secondary electron image of the pattern and an inclination angle of the pattern based upon a previously obtained relationship between the amount of secondary electron signal and an inclination angle of the specimen, segments the estimated first three-dimensional profile and the estimated second three-dimensional profile into small areas by a slope of the area, estimates a three-dimensional profile of the pattern by selecting the segmented profile which is sensitive to the slope from each of the segmented small areas, and reconstructs a three-dimensional profile of the pattern from the selected segmented profiles.

8. The apparatus as claimed in claim 7, wherein said second direction in which said focused electron beam is radiated to said pattern is set by changing the tilt of said table.

9. The apparatus as claimed in claim 7, wherein said second direction in which said focused electron beam is radiated to said pattern is set by changing the tilt of the optical axis of said focused electron beam.

10. The apparatus as claimed in claim 7, wherein:

said first secondary electron image obtaining means scans said specimen on said table with a focused electron beam incident on said specimen in a direction substantially normal to said specimen; and said second secondary electron image obtaining means scans said specimen on said table with a focused electron beam incident on said specimen from a direction at an angle to a normal to said specimen.

11. The apparatus as claimed in claim 7, wherein said processing means calculates said three-dimensional profile of said pattern based on information on the slope at each point on a surface of said pattern, said information being obtained from said first and second secondary electron images of said pattern obtained by said first and second secondary electron image obtaining means, respectively.

12. The apparatus as claimed in claim 7, wherein said second secondary image obtaining means scans said pattern with focused electron beams incident on said pattern from a series of different directions, detects variations in the amounts of secondary electron signal emitted from said pattern as a result of said scanning at said different beam incident directions, and determines said second observation direction based on said detected variations in said amounts of secondary electron signal.

13. The apparatus as claimed in claim 7, wherein said second secondary electron image obtaining means determines said second observation direction based on a cross-sectional profile model of said pattern.

14. The apparatus as claimed in claim 7, wherein:

said second secondary electron image obtained by said second secondary electron image obtaining means is a secondary electron image of a region of said pattern, said region including a sidewall surface of said pattern; and said processing means obtains information on the slope of a surface of said region including said sidewall surface of said pattern by calculating the slope at each point on said region based on the amount of secondary electron signal emitted from each point on said pattern by using a previously studied relationship between a sidewall inclination angle and the amount of secondary electron signal.

15. The method as claimed in claim 1, wherein in the step of estimating a three-dimensional profile of the pattern, the selected segmented profile which are sensitive to the slope indicate a large change in the amount of secondary electron signal per unit inclination angle change and are well approximated by a model modeling an actual relationship between inclination angle and the amount of secondary electron signal.

* * * * *